(12) United States Patent
Yakymyshyn et al.

(10) Patent No.: US 7,049,843 B2
(45) Date of Patent: May 23, 2006

(54) SIGNAL ACQUISITION PROBING SYSTEM USING A MICRO-CAVITY LASER CAPABLE OF SENSING DC VOLTAGES

(75) Inventors: Christopher P. Yakymyshyn, Seminole, FL (US); William Q. Law, Beaverton, OR (US); William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/077,691

(22) Filed: Mar. 10, 2005

(65) Prior Publication Data

US 2005/0200373 A1    Sep. 15, 2005

Related U.S. Application Data

(60) Provisional application No. 60/552,334, filed on Mar. 10, 2004.

(51) Int. Cl.
*G01R 31/26* (2006.01)
(52) U.S. Cl. ...................... 324/765; 324/753
(58) Field of Classification Search .............. 324/750, 324/751, 752, 753, 765, 158.1; 250/280.1, 250/25, 306–307
See application file for complete search history.

(56) References Cited

U.S. PATENT DOCUMENTS

| | | | |
|---|---|---|---|
| 4,196,396 A | | 4/1980 | Smith |
| 4,982,405 A | | 1/1991 | Zayhowski |
| 5,353,262 A | | 10/1994 | Yakymyshyn |
| 5,394,098 A | | 2/1995 | Meyrueix |
| 5,583,444 A | * | 12/1996 | Nakamura et al. .......... 324/750 |
| 5,590,090 A | | 12/1996 | Duggal |
| 5,754,333 A | | 5/1998 | Fulbert |
| 5,808,473 A | * | 9/1998 | Shinagawa et al. ......... 324/753 |
| 5,889,798 A | | 3/1999 | Molva |
| 6,028,423 A | * | 2/2000 | Sanchez ...................... 324/96 |
| 6,166,845 A | | 12/2000 | Ito |
| 6,288,530 B1 | * | 9/2001 | Tsuru et al. .................. 324/96 |
| 6,402,549 B1 | | 6/2002 | Ayres |
| 6,402,565 B1 | | 6/2002 | Pooley |
| 6,629,048 B1 | | 9/2003 | Law |

OTHER PUBLICATIONS

Y. Li et al., "Rapidly tunable millimeter-wave Optical transmitter for Lidar-Radar", Center for Microwave-Lightwave Engineering, Drexel University, Philadelphia, PA, pp. 1-23.
A.J.C. Vieira et al., "Nd:LiNbO3 Microchip Laser with 20 GHz Subcarrier," 1997 IEEE MTT-S Digest, pp. 229-232.

* cited by examiner

*Primary Examiner*—Vinh Nguyen
*Assistant Examiner*—Tung X. Nguyen
(74) *Attorney, Agent, or Firm*—William K. Bucher

(57) ABSTRACT

A signal acquisition probing system uses a micro-cavity laser to acquire an electrical signal from a device under test. The micro-cavity laser has VCSEL gain mediums and an electro-optic optical resonant cavity. The micro-cavity laser is pumped by an external laser source and generates polarized frequency modulated optical signals derived from the device under test electrical signal creating an electro-magnetic field distribution in electro-optic material in the micro-cavity laser that overlaps the optical path of the polarized optical signals propagating in the electro-optic material. The polarized frequency modulated optical signals are coupled to an optical receiver which converts the polarized frequency modulated optical signals to an electrical signal. The electrical signal is coupled to measurement test instrument for processing and displaying of the electrical signal.

13 Claims, 6 Drawing Sheets

SIGNAL ACQUISITION PROBING SYSTEM USING A MICRO-CAVITY LASER CAPABLE OF SENSING DC VOLTAGES

CROSS-REFERENCE TO RELATED APPLICATION

This application claims the benefit of the U.S. Provisional Application No. 60/552,334, filed Mar. 10, 2004.

BACKGROUND OF THE INVENTION

The present invention relates generally to signal acquisition probes and more particularly to signal acquisition probing systems using a micro-cavity laser capable of sensing DC voltages.

U.S. Pat. No. 4,982,405 teaches a Q-switched micro-cavity laser having a first resonant cavity consisting of a gain medium disposed between two optically reflective mirrors. A second optical resonant cavity is formed by two partially reflective mirrors and is physically and optically coupled to the first resonant cavity. The first resonant cavity will lase when pumped by an external optical source. The reflectivity of the intermediate mirror common to the first and second cavities as seen by the gain medium of the first resonant cavity looking toward the second resonant cavity is determined by the resonant modes of the second resonant cavity. It is therefore possible to prevent or permit the gain medium to lase by adjusting the second resonant cavity such that the resonances of the second cavity causes either low reflectivity of the common mirror, which prevents lasing, or high reflectivity in the common mirror, which induces lasing.

The '405 patent teaches a number of embodiments for varying the second resonant cavity. Of particular interest to the present invention, the second resonant cavity of formed of an electro-optic material disposed between the two partially reflective mirrors with two opposing electrodes disposed adjacent to the electro-optic material. Applying an electric field across the electro-optic material changes the index of refraction of the material, which varies the reflectivity of the intermediate mirror as seem by the gain medium in the gain cavity. This results in the micro-cavity laser generating a train of optical pulses that are dependent on the applied electrical field across the electro-optic material. The '405 patent also teaches that the second resonant cavity need not affect the gain cavity so much that the lasing is turned on or off. Instead, the resonant cavity can be used to modulate the intensity of the light produced by the gain medium.

A paper titled "Rapidly Tunable Millimeter-Wave Optical Transmitter for Lidar-Radar" by Y. Li, A. J. C. Vieira, S. M. Goldwasser and P. R. Herczfeld teaches the use of two electro-optical mono-mode micro-chip laser sections formed on a single composite crystal for producing a rapidly tunable millimeter wave optical transmitter. The side-by-side micro-chip lasers are formed with a $Nd:YVO_4$ gain medium resonant cavity and a $MgO:LiNbO_3$ electro-optic resonant cavity. The micro-chip lasers are optically pumped by independent 808 nm high power laser diodes. Electrodes are deposited on opposing sides of each of the electro-optic resonant cavities. A DC voltage is applied to one of the electrodes of one of the electro-optic resonant cavities, which changes the wavelength of the optical output with respect to the other micro-chip laser. The optical output of the micro-chip lasers are heterodyned resulting a tunable beat frequency range of 45 GHz with a voltage sensitivity of 10.6 MHz/V. The transmitter was set at an 8 GHZ bias point using a phase lock loop. A 10 MHZ, 18V peak-to-peak ramp signal is applied to one of the micro-chip lasers. The signal was recovered and measured, which showed a frequency excursion of 190.8 MHz over a 50 ns time corresponding to a chirp rate of 3816 THz/sec. The reference concludes by indicating continuing efforts to increase the voltage sensitivity by reducing the crystal thickness and improving the electrical contacts.

The strength of the electric field distribution within the electro-optic material is a function of the distance between the opposing electrodes and the amplitude of the applied electrical signal. The strength of the electric field is the inverse of the distance separation of the electrodes. As the distance between the electrodes decreases, the strength of the electric field between them increases. As the distance decreases, the magnitude of the electrical signal can decrease to generate the same amount of change in the index of refraction.

Currently, the minimum overall dimensions of the electro-optic material used in optical devices and cavities is limited by the practical size at which the material can be handled resulting in electrodes that are positioned at a substantial distance from the optical path of the optical signal. This results in optical devices having low sensitivity to the applied electrical signal.

There is an increasing need in the electronics industry for measurement test equipment, such as oscilloscopes, logic analyzers and the like, to measure electrical signals in the gigahertz range. Correspondingly, there is a need for measurement instrument signal acquisition probes that have the signal bandwidth to acquire such high frequency signals. Generally gigahertz bandwidth signal acquisition probes have active circuitry in the probing head of the probe that receives the electrical signal via a metal probing tip extending from the end of the probing head. Extensive design work is required to minimize probe tip inductance and capacitance that affect the overall bandwidth of the probe. In addition, the dielectric constant of the probe head material also needs to be minimized for gigahertz differential signal acquisition probes. A further complication for gigahertz signal acquisition probe designs is the signal loss through the coaxial cable that couples the probing head to the measurement instrument.

U.S. Pat. No. 5,808,473, titled "Electric Signal Measurement Apparatus Using Electro-Optic Sampling by One Point Contact" describes an electro-optic sampling high-impedance probe exploiting the Pockels effect to rotate the polarization state of a light beam. The Pockels effect changes the birefringence of an electro-optic crystal by an amount that is proportional to an electric field inside the crystal. With the proper application of electrodes to the crystal surface, and their connection to conductive probing tips, the polarization rotation can be made to respond to a voltage on a device under test (DUT). The electro-optic sampling high-impedance probe receives polarization maintained laser pulses via a single mode polarization maintaining fiber. The laser pulses are coupled through bulk optic devices onto an electro-optic element having a reflective film on one end. A metal pin in the end of the signal probe head abuts the reflective film on the electro-optic element. The metal pin couples an electrical signal from a device under test to the electro-optic element which alters the birefringence of the electro-optic element in response to the electrical field of the signal causing the polarization state of the laser beam to change. The laser beam having the changed polarization state is reflected by the reflecting film and coupled through polarization beam splitters which convert the S and P polarized beams into an intensity change. The S and P polarized beams are coupled through respective condensing lenses onto respective slow germanium photodetectors that convert the optical beams into electrical signals. The electrical signals are coupled to a measurement instrument and detected by a differential amplifier.

U.S. Pat. No. 6,166,845 describes a modification to the above described electro-optic sampling high-impedance probe. Instead of coupling laser pulses via a single mode polarization maintaining fiber to the probe, a laser diode is incorporated into the probe itself. The laser diode generates a pulsed laser output in response to an input pulse chain from the measurement instrument. The probe contains the bulk optic devices, electro-optic element and photodetectors as previously described. The metal pin couples the electrical signal from a device under test to the electro-optic element which alters the birefringence of the electro-optic element in response to the electrical field of the signal causing the polarization state of the laser beam to change. The S and P polarized beams are coupled through the beam splitters and the condensing lenses onto the photodetectors. The photodetectors convert the intensity beams into electrical signals and couple the electrical signals to the measurement instrument.

A drawback to this type of probe is the size of the probing head due to the number of optical elements contained therein. Further, voltage and signal lines are required to couple the voltage power to the laser diode and photodetectors, couple the drive signal to the laser diode and to couple the outputs of the photodetectors to the measurement instrument.

U.S. Pat. No. 5,353,262 describes an ultrasound optical transducer that generates an optical signal the frequency of which varies in correspondence with acoustic energy incident on the transducer. The transducer includes a housing in which is disposed a signal laser. The signal laser is preferably a microchip laser, microcavity laser or the like. The signal laser has an optical cavity disposed between first and second reflectors and in which a lazing medium (also known as a gain crystal) is disposed. The reflectors are disposed on opposing plane-parallel surfaces of the lasing medium. An optical source injects an optical signal at a first frequency into the signal laser, which generates a second output signal at a second frequency. Acoustic energy impinging on the transducer causes the index of refraction of the optical cavity to change which in turn, causes the frequency of the signal laser to change. The frequency modulated optical signal from the signal laser is coupled to signal processing assembly that generates an output signal corresponding to the amplitude of the incident acoustic energy for use in imaging and analysis. An alternative embodiment is described where a piezoelectric device is positioned on the transducer for converting the acoustic energy into an electrical signal. The electrical signal is applied to electrodes on the signal laser. The electrical signal causes a change in the index of refraction of the optical cavity as a function of the acoustic energy applied to the piezoelectric device.

U.S. Pat. No. 5,590,090 describes an ultrasound optical transducer that generates an optical signal the frequency of which varies in correspondence with acoustic energy incident on the transducer. The transducer incorporates an electrically pumped vertical cavity surface emitting laser (VCSEL) array. The cavity length of each laser or pixel of the array is modulated by the acoustic field at the point where the acoustic field contacts the pixels. The resulting laser output is frequency modulated by the acoustic field. The modulation is converted into amplitude modulation at the detector head and then wither detected with a charged couple device (CCD) array with the information being electrically communicated to a signal processing assembly or sent directly by optical fiber to the signal processing assembly.

What is needed is a signal acquisition probing system using a micro-cavity laser that senses DC voltages. The micro-cavity laser used in the signal acquisition probing system needs to provide greater sensitivity to an applied electrical signal to allow measurement small voltage signals.

SUMMARY OF THE INVENTION

Accordingly, the present invention is a signal acquisition probing system for sensing an electrical signal from a device under test. The signal acquisition probing system has an optical transmitter generating a coherent optical signal that is used to optically pump a micro-cavity laser. The micro-cavity laser having an optical gain cavity formed with two vertical cavity surface emitting lasers disposed between opposing optically reflective materials. The optical gain medium and generates first and second polarized optical outputs whose polarization states are orthogonal to each other. The polarized optical outputs from the optical gain medium are coupled to an optical resonant cavity having electro-optic material disposed between opposing optically reflective materials with one of the optically reflective materials being a common reflective material with one of the optical reflective materials of the optical gain cavity. The optical resonant cavity has first and second electrically conductive electrodes receiving the electrical signal from the device under test. Each of the first and second electrically conductive electrodes are formed in at least a portion of the electro-optic material generally parallel to the first and second polarized optical outputs propagating within the electro-optic material. The first and second electrically conductive electrodes are oriented along an axis bisecting the polarization states of the first and second polarized optical outputs. An optical transmission system is optically coupled to the optical transmitter, micro-cavity laser and an optical receiver. The optical transmission system provides the optical signal from the optical transmitter to the micro-cavity laser and provides first and second polarized frequency modulated optical signals to the optical receiver. The first and second polarized frequency modulated optical signals represent the electrical signal from the device under test derived from the device under test electrical signal creating an electromagnetic field distribution in the electro-optic material that overlaps the optical path of the first and second polarized optical outputs propagating in the electro-optic material, which varies the index of refraction of the electro-optic material in the optical path. The optical receiver generates an output electrical signal from the first and second polarized frequency modulated optical signals from the micro-cavity laser.

The electro-optic material in the optical resonant cavity has X, Y, and Z optical axes and corresponding crystal faces orthogonal to the respective X, Y, and Z optical axes. The optically reflective materials may be disposed on the opposing crystal faces orthogonal to one of the X, Y, and Z optical axis. The received optical signal from the optical gain medium propagates generally parallel to at least one of the optical axes in the electro-optic material with the first and second electrically conductive electrodes generally parallel to same optical axis. Electrically conductive contacts may be formed on an exterior surface of the micro-cavity laser that are electrically coupled to one of the electrically conductive electrodes. Additionally, a resistor may be coupled between the electrically conductive electrodes or between the electrically conductive contacts. Further, individual resistors may be electrically coupled to each electrically conductive electrode or the electrically conductive contacts coupled to the electrodes. An acoustic damping material covers a substantial portion of the micro-cavity laser to minimize acoustic modes in the micro-cavity laser.

The optical transmission system has an optical bean splitter coupled to receive the optical signal from the optical transmitter and the polarized frequency modulated optical signals from the micro-cavity laser. A first collimating lens is optical coupled to the beam splitter and a second collimating lens is optically coupled to the micro-cavity laser. A polarization maintaining single mode optical fiber is coupled between the first and second collimating lenses.

The optical receiver has a birefringent etalon optically coupled to receive the polarized frequency modulated optical signals from the micro-cavity laser via the optical beam splitter of the optical transmission system. The birefringent etalon generates polarized intensity modulated optical signals representative of the electrical signal from the device under test. A non-polarizing beam splitter receiving the polarized intensity modulated optical signals and couples a first portion to a first optical-to-electrical converter and a second portion to a polarizing beam splitter. The first optical-to-electrical converter generates an electrical signal representative of the electrical signal under test. The electrical signal from the first optical-to-electrical converter is coupled to an amplifier that generates an amplified electrical signal representative of the electrical signal from the device under test. The polarizing bean splitter couples one of the polarized intensity modulated optical signals to a second optical-to-electrical converter and the other polarized intensity modulated optical signal to a third optical-to-electrical converter. Each of the second and third optical-to-electrical converters generates an electrical signal representative of one of the respective polarized intensity modulated optical signals. An amplifier circuit receives the electrical signals from the second and third optical-to-electrical converters and generates an electrical signal representative of the difference over the sum of the electrical signals from the second and third optical-to-electrical converters. The electrical signal from the amplifier circuit is coupled to a tilt control that is coupled to the birefringent etalon. The tilt control tunes the birefringent etalon to maintain lock between the birefringent etalon and the micro-cavity laser.

The objects, advantages and novel features of the present invention are apparent from the following detailed description when read in conjunction with appended claims and attached drawings.

DETAILED DESCRIPTION OF THE PREFERRED EMBODIMENT

Figure 1:
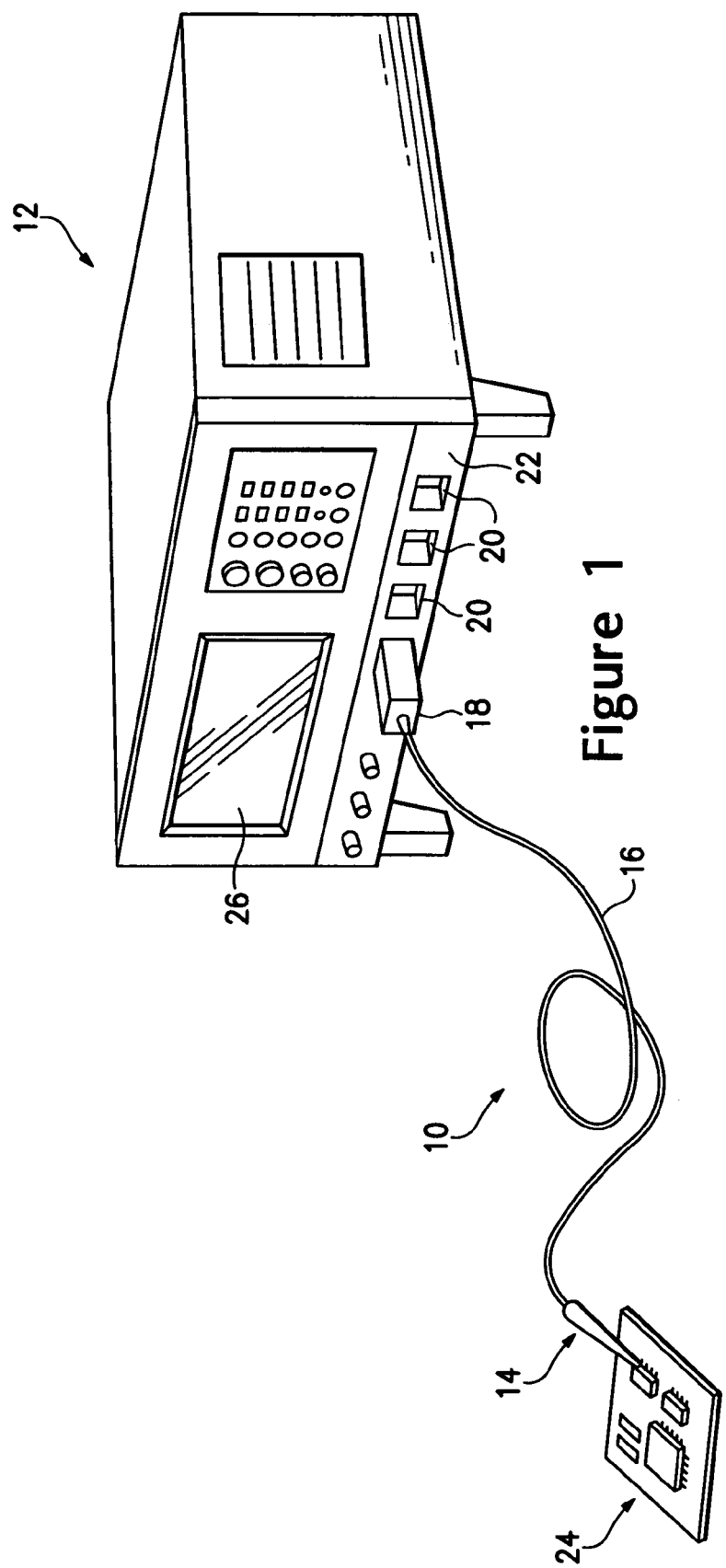
FIG. 1 illustrates the signal acquisition probing system according to the present invention.

Referring to FIG. 1, there is illustrated a signal acquisition probing system 10 coupled to a measurement instrument 12, such as real-time or sampling oscilloscopes, logic analyzer, vector network analyzer, or the like. The signal acquisition probing system 10 has a probing head 14 containing a micro-cavity laser and an optical transmission system 16 extending from the probing head 14 to a probe interconnect housing 18. The probe interconnect housing 18 contains signal acquisition probing circuitry needed to provide an optical signal to the probing head 14 and convert returning frequency modulated optical signals to an electrical signal. The optical transmission system 16 includes a polarization maintaining single mode optical fiber. The probe interconnect housing 18 is removably connected to one of several interconnect receptacles 20 on the front panel 22 of the measurement instrument 12. The probe interconnect housing 18 and interconnect receptacles 20 are preferably TekConnect® interface devices such as described in U.S. Pat. No. 6,402,565 and incorporated herein in its entirety by reference. The TekConnect® interface has connections for coupling a wide bandwidth signal to measurement instrument, providing electrical power from the measurement instrument 12 to the probe interconnect housing 18 and communication signals between the measurement instrument 12 to the probe interconnect housing 18 as described in U.S. Pat. No. 6,629,048 and incorporated herein in its entirety by reference. The electrical signal representing the measured signal from the device under test 24 is coupled to acquisition circuitry within the measurement instrument 12 that converts the electrical signal into digital data values and stores the data values in memory. Processing circuitry operating under program control processes the digital data values to produce display data that is displayed on a display device 26, such as a liquid crystal display, cathode ray tube or the like. Alternately, the measurement instrument 12 may include the signal acquisition probing circuitry. The probe interconnect housing 18 would then include an optical connector for coupling the optical signal to the probing head 14 and the return frequency modulated optical signals to the measurement instrument 12.

The below described signal acquisition probing system 10 has the capability to sense DC voltages of a signal under test. The approach is to create two frequency modulated laser signals from a single laser cavity. The two frequencies can be separated at a slope filter. The laser signals are modulated in a complementary fashion by the signal under test. In this way, the outputs of the slope filter can be combined to generate a differential signal that is immune to errors affecting both the laser cavity signals, such as temperature drift, mechanical shock, and the like. The signal acquistion probing system 10 uses two orthogonal linearly polarized states to allow separation of the two laser cavity output frequencies. Circularly polarized orthogonal states could also be used.

Figure 2:
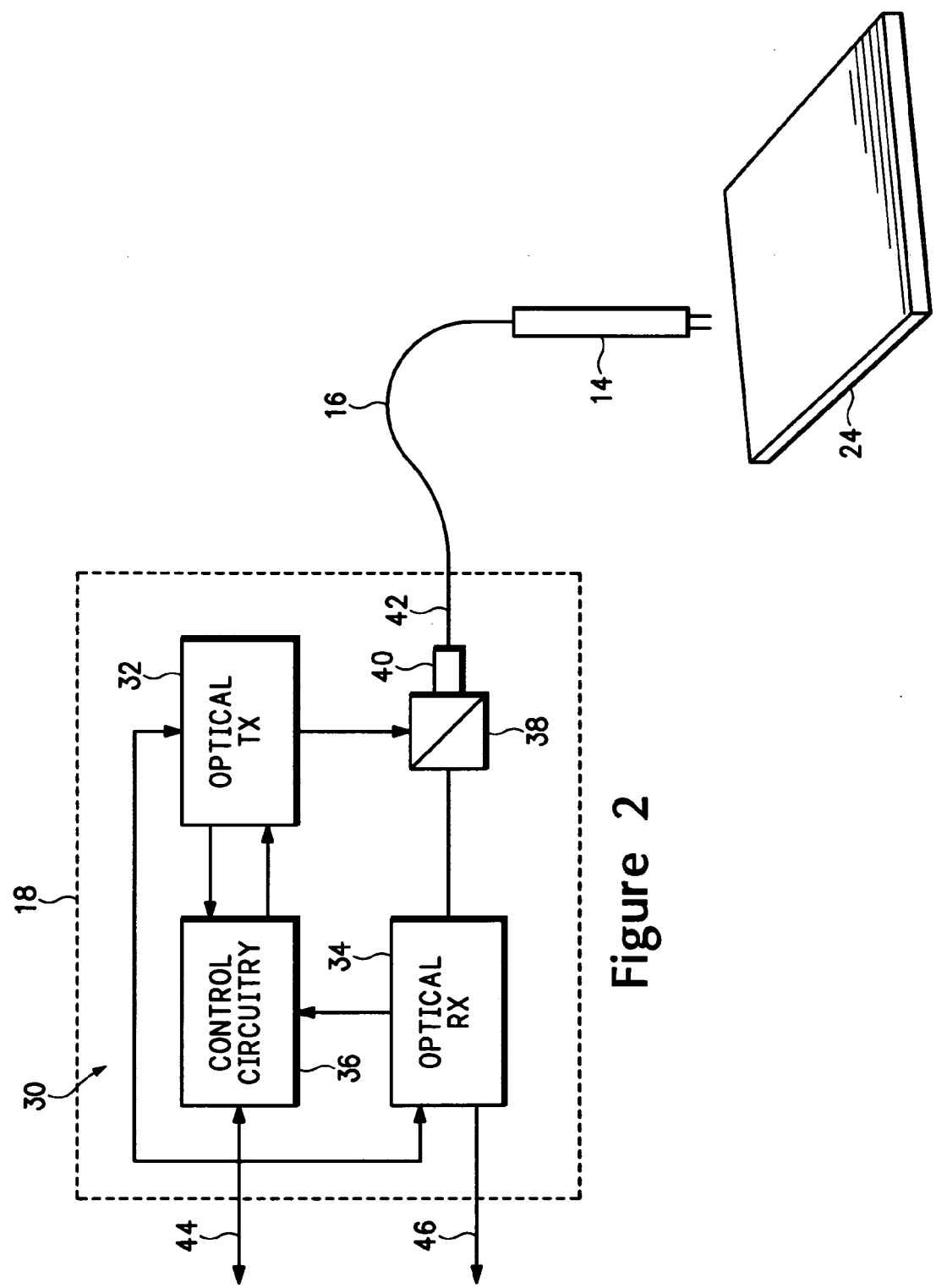
FIG. 2 general block diagram of the circuitry in the signal acquisition probing system according to the present invention.

FIG. 2 is a general block diagram of the signal acquisition probing circuitry 30 disposed in the probe interconnect housing 18 for a probing head 14 having a micro-cavity laser functioning as a voltage signal sensor. The signal acquisition probing circuitry 30 includes an optical transmitter 32, optical receiver 34 and control circuitry 36 for the optical transmitter 32 and receiver 34. The optical output from the optical transmitter 32 and the optical input to the optical receiver 34 are coupled through an dichroic optical beam splitter 38 in the optical transmission system 16. A collimating lens 40 focuses the optical signal from the beam splitter 38 into a polarization maintaining single mode optical fiber 42. The polarization maintaining single mode optical fiber 42 couples the optical output of the optical transmitter to the micro-cavity laser in the probing head 14 and couples frequency modulated optical signals from the micro-cavity laser to the beam splitter 38. Data/control and voltage power lines 44 couple the signal acquisition probing circuitry 30 in the probe interconnect housing 18 to the measurement instrument 12. A high speed coaxial interconnect 46 couples the electrical signal from the optical receiver 34 to the measurement instrument 12.

Figure 3:
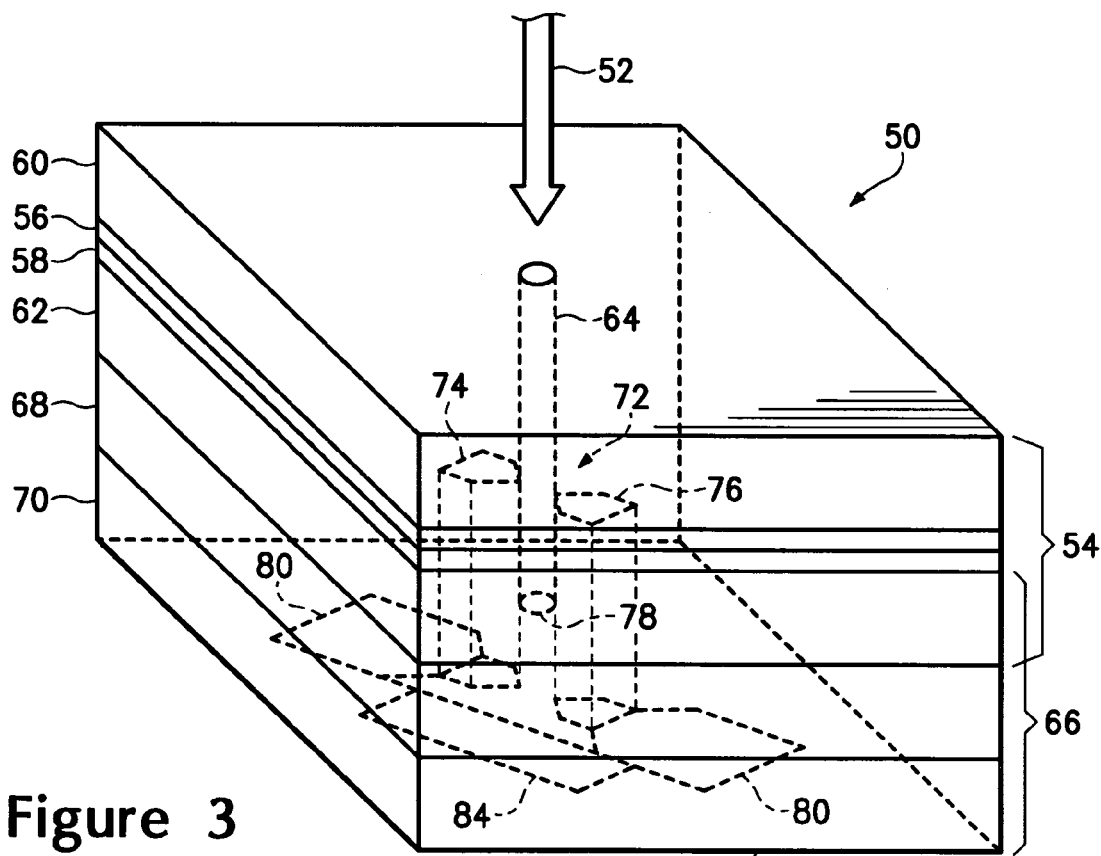
FIG. 3 illustrate the micro-cavity laser used in a signal acquisition probing system according to the present invention.
Figure 3:
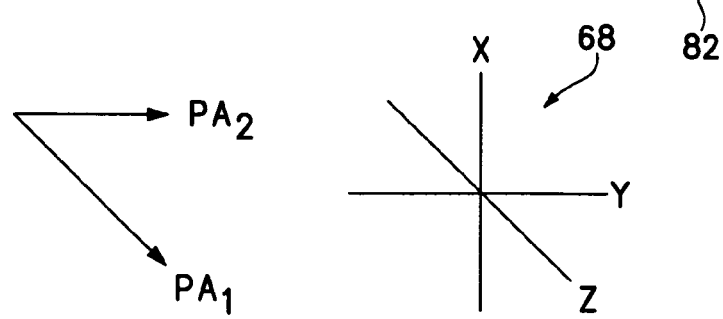

Referring to FIG. 3, there is shown the a micro-cavity laser 50 disposed in the probing head 14 of the signal acquisition probing system 10. The micro-cavity laser 50 receives an optical signal 52 from the optical transmitter 32. The micro-cavity laser 50 has an optical gain cavity 54 implemented with two vertical cavity surface emitting laser (VCSEL) crystals 56 and 58. The VCSELs are active gain mediums that are disposed between two optically reflective materials 60 and 62. The VCSEL laser crystals 56 and 58 are of the group of inorganic crystals, such as GaAs, AlGaAs, InGaAsP and the like, that generate a coherent, polarized optical output 64 when either pumped by an coherent optical input, such as the optical signal 52 or by a forward bias voltage on the VCSEL. Alternately, the active gain medium maybe formed of other crystalline materials, such as Neodymium doped Yttrium Orthovanadate (Nd:YVO$_4$) or the like. An optical resonant cavity 66 is coupled to the optical gain cavity 54 and has an electro-optic material 68 disposed between opposing optical reflective materials 62 and 70 where the optically reflective material 62 is common to the optical gain cavity 54.

The optically reflective materials 60, 62 and 70 are preferably ceramic mirrors formed from layers of zirconium dioxide, silicon dioxide and silicon nitride. It is important in certain applications that the optically reflective materials be non-metallic to reduce capacitive and inductive effects. The reflectivity of the optically reflective materials 60, 62 and 70 vary depending on the proposed application for the micro-cavity laser 50. The optically reflective materials 60, 62 and 70 may be partially reflective or totally reflective to particular wavelengths of light. For example, optically reflective material 60 may have low reflectivity for the pump laser light (e.g. 5% reflectivity) of the optical signal 52 and high reflectivity (e.g. 99.5% reflectivity) for the laser light 68 generated by the gain mediums 56 and 58. The optical reflective material 62 may have high reflectivity for the pump laser light (e.g. greater than 90% reflectivity) and medium reflectivity for the laser light 68 of the VCSEL lasers 56 and 58 (e.g 50% reflectivity). The optically reflective material 70 generally has a high reflectivity (e.g. 95 to 99.5% reflectivity) depending on the output direction of the laser light 64 from the micro-cavity laser 50. The reflectivity of the optical reflective medium 70 is a high as possible for generating an output along the same path as the pump laser light. The reflectivity of the optically reflective material 70 is as high as 99.5% for generating an output opposite that of the pump laser light.

The VCSELs 56 and 58 produce polarized laser light of a frequency determined by the modes of the micro-cavity laser 50. Applying an electromagnetic field across the electro-optic material 68 changes the index of refraction of the material, causing the reflectivity of the optically reflective material 68 to vary as seen by the VCSELs 56 and 58 in the optical gain cavity 54. The application of the varying electromagnetic field results in frequency modulation of the laser light 64 of the VCSELs 56 ans 58 as the reflectivity of the common optically reflective material 22 seen by the VCSELs 56 and 58 changes due to resonances in the optical resonant cavity 66.

The electro-optical material 68 in the optical resonant cavity 66 may be formed from inorganic crystal material, such as Zinc Telluride (ZnTe), Cadmium Telluride (CaTe), Zinc Selenide (ZnSe), Gallium Arsenide (GaAs), Indium Phosphide (InP), or other electro-optic materials having a cubic 43 m symmetry and having the property of a changing index of refraction in response to an applied electromagnetic field. The inorganic crystal materials further have X, Y and Z optical axes which coincide with the crystallographic axes.

The optical resonant cavity 66 will be described below in relation to Zinc Telluride (ZnTe) electro-optic material having optical axes coincident with the crystallographic axes. The present invention will be described in relation to specific optical axes of the Zinc Telluride electro-optic material 68 and a specific orientation of a propagating laser light 64 and orientations of the electromagnetic field within the Zinc Telluride electro-optic material 68. In the preferred embodiment, the Zinc Telluride electro-optic material 68 is an X-cut crystal face where the cleaved and polished surfaces of the crystal are perpendicular to the optical X-axis. Alternatively, the Zinc Telluride electro-optic material 68 may be a Y-cut crystal face. The X-cut crystal is preferred over the Y-cut crystal for minimizing distortions from the acoustic modes generated within the electro-optic material 68.

The micro-cavity laser 50 has an electrode structures 72 formed in the optical resonant cavity using well known semiconductor manufacturing processes. The electrode structure 72 has electrically conductive electrodes 74 and 76 formed in the optically reflective material 70 and the Zinc Telluride electro-optic material 68 that are generally parallel to the optical path 78 of the laser light 64 from the optical gain cavity 54 propagating through the electro-optic material 68. The electrically conductive electrodes 74 and 76 are formed in the electro-optical material parallel to the principle dielectric axis of the electro-optical material 68 that provides the largest changes in the index of refraction for an applied electro-magnetic field. The electrically conductive electrodes 74 and 76 are disposed on the opposite sides of the optical path 78 of the propagating laser light 64. The electrically conductive electrodes 74 and 76 are preferably formed as close as possible to the optical path 78 of the propagating laser light 64 with the electrode separation, for example, being in the range of 45 to 120 microns. In some applications, the electrically conductive electrodes 74 and 76 may extend into the optical path 78 of the propagating laser signal 64. The electrically conductive electrodes 74 and 76 have a polygonal sectional shape with an apex directed toward the optical path 78 of the propagating laser signal 64. The apexes of the polygonal shapes concentrates the electromagnetic field across the optical path 78. Alternately, the electrically conductive electrodes 76 and 78 maybe circular in form. Electrically conductive contacts 80 maybe formed on the exterior surface 82 of the micro-cavity laser 50 using well know deposition techniques, such as thin and thick film processes. The electrically conductive contacts 80 are preferably formed of gold deposited over a layer of chromium. Each of the electrically conductive contacts 80 is preferably a polygonal shape with an apex electrically coupled to one of the electrically conductive electrodes 74 and 76. In the embodiment where the electrically conductive electrodes are circular, the separation between the electrically conductive contacts 80 is in the range of 15 to 100 microns with the electrically conductive electrodes 74 and 76 set slightly back from the apexes of the contacts 80.

The described electrode structure 72 has an high input impedance. In certain applications it may be preferable to match the impedance of the electrode structure 72 to the impedance of the device under test 24. An optional termination resistor 84 is shown formed on exterior surface 82 of the micro-cavity laser 50. The termination resistor 84 is connected between the electrically conductive electrodes 74 and 76 of the optical resonant cavity 66. The termination resistor 84 may be formed using well known processing techniques, such as thin or thick film processing. The resistance of the termination resistor 84 is set to match the impedance of the electrical device driving the optical resonant cavity 66.

The VCSELs 56 and 58 are oriented with their polarization axes at right angles to each other as represented by the mutually perpendicular axes $PA_1$ and $PA_2$. The pumped laser light 52 from the optical transmitter 32 is partially absorbed by the first VCSEL 56 and continues to be absorbed by the second VCSEL 58. This combination lases simultaneously in two polarization states. The length of the VCSELs 56 and 58 are selected so that equal amounts of pump laser light 52 are absorbed in both VCSELs 56 and 58. The polarization states of the two lasing modes are selected to be +45° and −45° to the principle dielectric Z-axis of the electro-optic material 68 in the optical resonant cavity 66. The two polarization states see equal but opposite frequency modulation through the Pockels effect in the electro-optic material 68. Frequency modulation due to temperature changes in the micro-cavity laser 50 are common-mode to both polariztion states.

Figure 4:
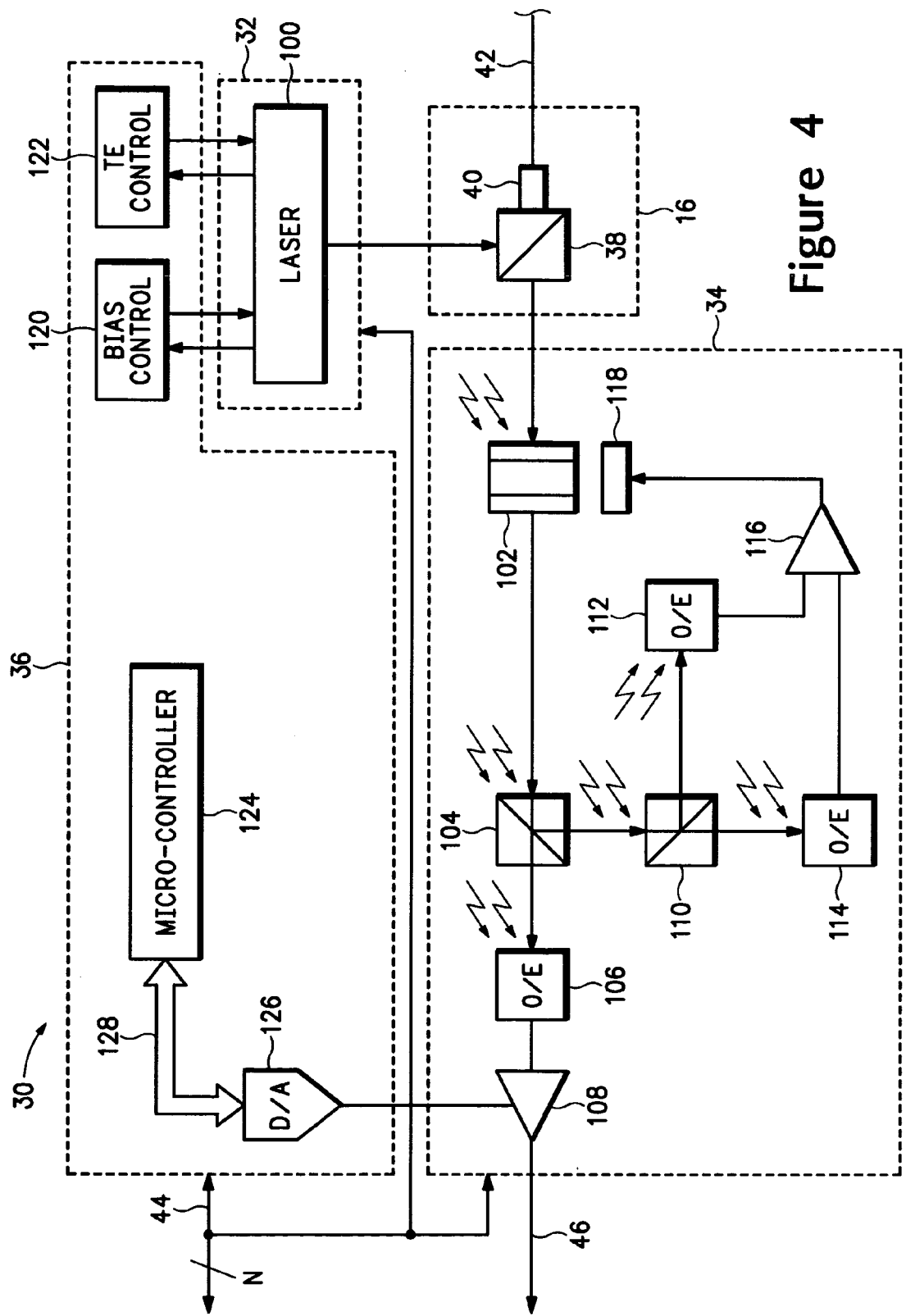
FIG. 4 illustrates more detailed block diagram of the circuitry in the signal acquisition probing system according to the present invention.

FIG. 4 is a more detailed block diagram of the signal acquisition probing circuitry 30 in the probe interconnect housing 18. The optical transmitter 32 is preferably a laser diode 100 generating an optical output having a wavelength in the range of 600 to 1500 nm. The laser diode 100 includes a thermoelectric (TE) cooler and thermistor for controlling the wavelength of the laser output and a photodetector for generating an electrical output representative of the magnitude of the laser output. The optical receiver 34 has a birefringent etalon 102 acting as a slope filter receiving the frequency modulated optical signals from the beam splitter 38. The birefringent etalon 102 is composed of an optical wave-plate. The two polarization states returning along the polarization maintaining optical fiber 42 are aligned with the principle axes of the wave-plate. Each polarization state sees a separate etalon transmission curve. The birefirgent etalon 102 converts the frequency modulated optical signals into polarized intensity modulated optical signals, which are coupled though a non-polarizing bean splitter 104. A substantial portion of the polarized intensity modulated optical signals is coupled through the beam splitter 104 and superimposed on a high-speed optical-to-electrical converter (O/E) 106, such as a PIN or avalanche photodiode. The O/E converter 106 converts the superimposed intensity modulated optical signals to an amplitude modulated electrical signal representative of the signal being measured on the device under test 14. The electrical signal from the O/E converter 106 is amplified by amplifier circuitry 108 and coupled via the coaxial interconnect 46 to the measurement instrument 12. The remaining portion of the polarized intensity modulated optical signal from the beam splitter 104 is coupled to a polarizing bean splitter 110. The polarizing beam splitter 110 couples one of the polarized intensity modulated optical signals to a first slow detector 112 and the other polarized intensity modulated optical signal to a second slow detector 114. The first and second slow detectors are preferably optical-to electrical converters implemented as a phtodiode. The output of the first and second slow detectors 112 and 114 are provided to a amplifier circuit 116, which is preferably a delta sigma amplifier. The output of the amplifier circuit 116 is the difference over the sum of the two detector signal and provides a feedback signal to a tilt control 118 for the etalon 102. The tilt control 118 tunes the etalon 102 so that the frequencies of both polarization states coincide with the intersection point of the two etalon transmission curves near a transmission of 0.55 to maintain lock between the etalon 102 and the micro-cavity laser 50. The tilt control 118 may be mechanical, electrical or thermal.

The control circuitry 36 includes bias and thermo-electric (TE) control circuitry 120 and 122 for maintaining the laser output at a constant level and at an optimum wavelength. The bias control circuitry 120 provides a feedback loop to maintain the optical output of the laser 100 at a constant level. The laser 100 includes a photodetector who current output is coupled to the inverting input of a positive gain drive amplifier. The non-inverting input of the drive amplifier is coupled to a reference voltage. As the output of the photodetector increases and decreases with changes in the output power of the laser 100, the signal applied to the inverting input of the drive amplifier varies the output of the drive amplifier. The drive amplifier varies the bias on the laser 100 to maintain the laser output at a constant level.

The TE control circuitry 122 provides a feedback loop to maintain the optical output of the laser 100 at a predetermined wavelength. The laser 100 package includes a thermo-electric cooler and a thermistor. The output of the thermistor varies in response to temperature changes of the laser 100. The thermistor output is coupled to inverting input of a TE cooler drive amplifier. The non-inverting input of the drive amplifier is coupled to a reference source. The TE control circuitry 122 is designed to produce the equal voltages on the inverting and non-inverting inputs of the TE cooler drive amplifier when the laser 100 generates the optimum output laser wavelength. Changes in the output of the thermistor causes the voltage to the inverting input of the TE drive amplifier to increase or decrease causing the output voltage of the TE drive amplifier to change. The output of the TE drive amplifier is applied to the TE cooler in the laser 100 which causes the wavelength of the laser 100 to increase or decrease accordingly.

The control circuitry 36 also includes a micro-controller 124 that communicates with the measurement instrument 12 via data/control and voltage lines 44. The data/control and voltage lines 44 also provides electrical power to the optical transmitter and receiver and control circuitry 32, 34, 36. The micro-controller 124 is shown coupled a digital-to-analog converter (D/A) 126 via the data and control bus 128 for controlling the gain of the amplifier circuitry 108. Additional electronically controlled circuitry, such as variable attenuators, gain cells and the like, may be incorporated into the output signal path of the optical receiver 34.

Figure 5:
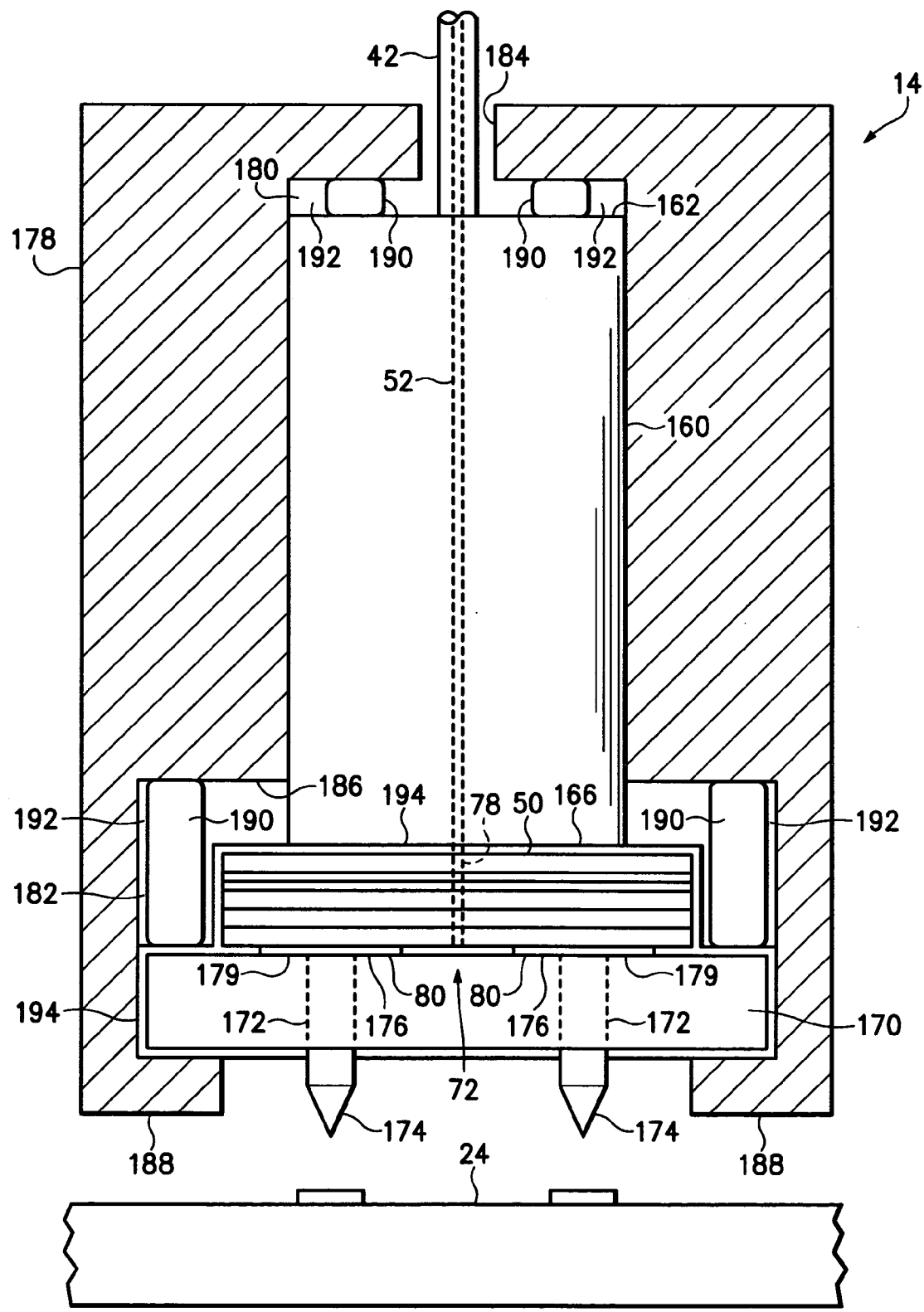
FIG. 5 illustrates a partially sectioned view of the probing components within the probing head in the signal acquisition probing system according to the present invention.

FIG. 5 is a partially sectioned view illustrating the probing components within the probing head 14. The probing components include a collimating lens 160 having a top flat surface 162 which receives the polarization maintaining optical fiber. The micro-cavity laser 50 is secured to the opposing bottom surface 166 of the collimating lens using a non-conductive adhesive, such as epoxy or the like. The preferred structure of the micro-cavity laser 50 is essentially the same as previously described. The micro-cavity laser 50 has the electrode structure 72 with electrically conductive contacts 80 formed on the bottom exterior surface of the micro-cavity laser 50. The reflective coating 60, 62 and 70 that form parts of the micro-cavity laser 50 are formed of the previously described non-conductive materials. It is important in probing applications to minimize conductive materials near the micro-cavity laser 50 to limit inductive and capacitive interference in the operation of the micro-cavity laser. The micro-cavity laser 50 has a preferred length and width of 1 mm and a thickness along the optical X-axis of approximately 20 microns. The optics in the collimating lens 160 produces a collimated beam 52 from the optical fiber 42 that is focused along an optical path 78 substantially parallel to the electrode structure 72 in the micro-cavity laser 50. The frequency modulated optical signals generated within the micro-cavity laser 50 exits through the reflective coating 60 and passes through the collimating lens 160, which focuses the frequency modulated optical signal on the optical fiber 42.

Disposed adjacent to the bottom surface of the micro-cavity laser 50 is a probe contact substrate 170 for supporting probing contacts, such as contact pads and probing tips. The probe contact substrate 170 is preferably formed of a non-conductive material, such as alumina, circuit board material or the like. In one embodiment, the probe contact substrate 170 has apertures 172 formed therein for receiving electrically conductive probing tips 174. The electrically conductive probing tips 174 are electrically coupled to the electrically conductive contacts 80 on the micro-cavity laser 50. The electrically conductive probing tips 174 may directly contact the electrically conductive contacts 80 but it is preferable that electrically conductive contacts 176 be formed on the upper surface of the probe contact substrate 170 that are electrically coupled to the probing tips 174. The electrically conductive contacts 176 on the probe contact substrate 170 electrically contact the electrically conductive contacts 80 on the micro-cavity laser 50. A conductive adhesive, such as epoxy or the like, is applied to the contacts 80 and 176 for securing the probe contact substrate 170 to the micro-cavity laser 50. Alternately, flexible type electrical contacts be disposed between the probing pins 174 and the contacts 80. The flexible type contacts may take the form of electrically conductive elastomers, flexible C-type string contacts, or the like. A mechanical registration element would attach the probe contact substrate 170 to the micro-cavity laser 50. In a further embodiment, the apertures 172 and probing tips 174 may be replaced with protrusions extending from the bottom of the probe contact substrate 170 forming the probing contacts. Electrically conductive material, such as gold plated over a layer of chromium, is disposed on the bottom surfaces of the protrusions. Electrically conductive vias are formed in the probe contact substrate 170 to electrically couple the electrically conductive contacts on the protrusions to the top surface of the substrate 170.

Optical cavities used as voltage sensing devices, such as the micro-cavity laser 50, are high impedance devices. In certain probing applications it may be preferable to match the impedance at the probe to the impedance of the device under test 24. As previously described in relation to FIG. 3, the optional termination resistor 84 may be connected between the electrically conductive electrodes 74 and 76 of the electrode structure 72 or between the electrically conductive contacts 80 on the exterior surface 82 of the micro-cavity laser 50. The resistance of the termination resistor 84 is set to match the impedance of the device under test 24. This allows differential measurements to be made in a defined impedance environment, such as 50 ohms. Terminating the sensing device in the impedance of the device under test improves signal fidelity by reducing the reflections that would be caused by impedance mismatches between the device under test and the sensing device. The resistance of the termination resistor 84 may be set to various values to conform to specific device under test impedance environments. In addition, damping resistors 179 may be formed on the exterior surface of the micro-cavity laser 50 and coupled in series with each of the electrically conductive electrodes of the electrode structure 72. The damping resistors 179 may also be formed on the probe contact substrate 170 in series with the electrically conductive contacts 176 formed on the upper surface of the probe contact substrate 170.

The collimating lens 160, the micro-cavity laser 50 and the probing contact substrate 170 are disposed within a non-conductive housing 178, formed from ABS plastic, poly-carbonate, poly-carbonate ABS, poly-phenylene sulfide or the like. The housing has a first cavity 180 for receiving the collimating lens 160 and a second cavity 182 for receiving the micro-cavity laser 50 and the probe contact substrate 170. The housing has an opening 184 extending from the top surface of the housing to the first cavity 180 to allow the optical fiber 42 to be connected to the collimating lens 160. The interface between the first and second cavities 180 and 182 defines a shoulder 186. A rib 188 is formed at the bottom of the housing 178 that protrudes into the second cavity 182 for supporting the probe contact substrate 170, the micro-cavity laser 50 and the collimating lens 160. The first and second cavities 180 and 182 are sized to closely conform to the lateral dimensions of the collimating lens 160 and the probe contact substrate 170. Both cavities 180 and 182 are sized to provide excess vertical clearance for the collimating lens 160 and the probe contact substrate 170 so as to provide axial movement of the probing elements within the housing 178. A spring mechanism 190, in the form of elastomeric material, mechanical springs or the like, is provided in the gaps 192 between the housing 178 and the collimating lens 160 and the probe contact substrate 170. The housing 178 is disposed within a probing head shell that provides strain relief for the optical fiber 42 and protection and support for the elements within the housing 178.

An acoustic damping material 194 may be applied to substantially all of the surfaces of the micro-cavity laser 50 leaving gaps for the optical signals leaving and entering the collimating lens 160 and for the electrical connections between the electrically conductive contacts 80 on the micro-cavity laser 50 and the electrically conductive contacts 176 on the probe contact substrate 170. In the preferred implementation, the acoustic damping material 194 is applied to substantially all of the outer exposed surfaces of the micro-cavity laser 50 and the probe contact substrate 170. A gap is provided on the top surface of the micro-cavity laser 50 for the optical signals leaving and entering the collimating lens 160 and the probing contacts 174 extending from the bottom of the probe contact substrate 170 are left exposed.

The probe interconnect housing 18 is plugged into one of the interconnect receptacles 20 in the measurement instrument 12. Parameters may be set for the signal acquisition probing system 10, such as gain or attenuations levels of the optical receiver or the like, using controls on the measurement instrument 12 or via commands sent to the measurement instrument 12 via an external communications bus.

The optical transmitter 32 in the signal acquisition probing circuitry 30 generates an optical output that is coupled via the polarization maintaining single mode optical fiber 42 in the optical transmission system 16 to the bulk optic collimating lens 160. The collimating lens 160 focuses the optical signal on the micro-cavity laser 50. The user contacts the probing head 14 to a selected test node on the device under test 24 to acquire a signal to be measured. The measured signal may be a differential signal or a single signal. The measured signal is coupled through the probing contacts or pins 174 of the probe contact substrate 170 to the electrode structure 72 in the micro-cavity laser 50. The electrical signal on the electrode structure 72 varies the index of refraction of the electro-optic material 68 in the micro-cavity laser 50 as a function of the magnitude changes in the electric signal. The changing index of refraction in the electro-optic material 68 causes corresponding changes in the wavelength of the laser signals in the micro-cavity laser 50. The frequency modulated optical signals pass out of the micro-cavity laser 50 into the collimating lens 160 which focuses the frequency modulated optical signals onto the end of the optical fiber 42. The optical fiber 42 couples the frequency modulated optical signal to the beam splitter 38. The beam splitter 38 coupled the frequency modulated optical signals to the birefringent etalon 102 in the optical receiver 34 of the signal acquisition probing circuitry 30. The birefringent etalon 102 converts the frequency modulated optical signals into polarized intensity modulated optical signals that are coupled to the nonpolarizing beam splitter 104. The nonpolarizing beam splitter 104 superimposes a substantial portion of the polarized intensity modulated optical signals to the O/E converter 106. The O/E converter 106 converts the polarized intensity modulated optical signals into an electrical signal representative of signal being measured on the device under test 24. The electrical output from the O/E converter 106 is amplified in the amplifier circuitry 108 and coupled to the measurement instrument 12 via the high speed coaxial interconnect 46. The remaining potion of the polarized intensity modulated optical signals from the beam splitter 104 coupled through a polarizing beam splitter 110. The polarizing beam splitter 110 couples one of the polarized intensity optical signals to a first slow detector 112 and the other polarized intensity modulated optical signal to a second slow detector 114. The outputs of the first and second slow detectors 112 and 114 are provided to a amplifier circuit 116, which provides a feedback signal to a tilt control 118 for the etalon 102. The tilt control 118 tunes the etalon 102 to maintain lock between the etalon 102 and the micro-cavity laser 50.

Figure 6:
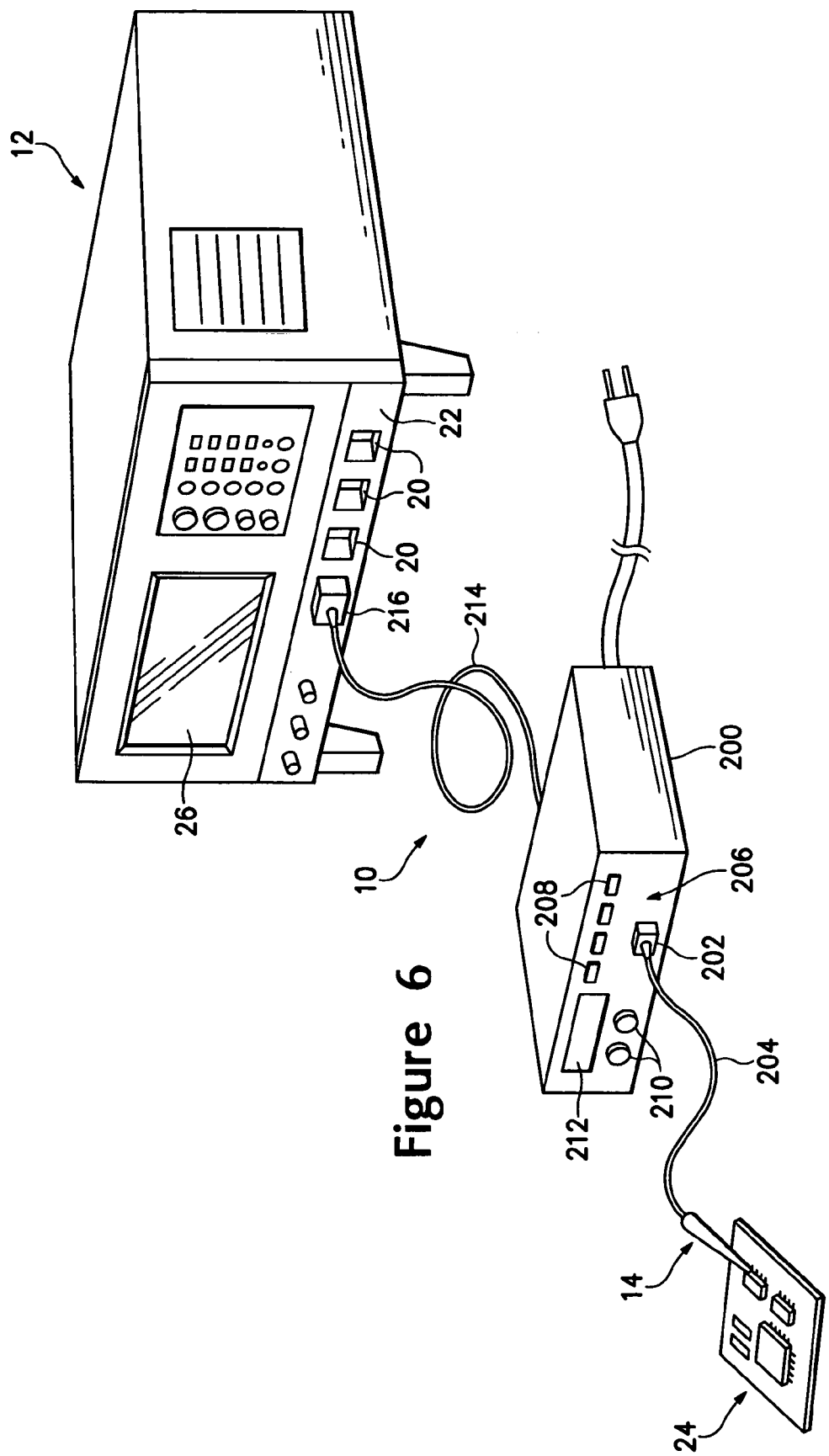
FIG. 6 illustrates a further embodiment of the signal acquisition probing system according to the present invention.

FIG. 6 illustrates a further embodiment of the signal acquisition probing system 10 for probing electrical signal on a device under test 24. The probe interconnect housing 18 is replaced with an independently powered probe controller 200 and an interconnect adapter 216. The probe controller 200 contains the optical transmitter 32 that provides the optical signal to the probe head 14 and the optical receiver 34 that converts the returning frequency modulated optical signals to an electrical signal. The probe controller 200 also includes associated processing circuitry, such as a microcontroller, memory, ASICs and the like, and a power supply for generating the necessary voltages for operating the circuitry within the controller 200. The probe controller 200 includes at least a first optical connector 202 for coupling optical signals to and from the probing head 14. The probe controller 200 may include front panel controls 206, such as switches 208, knobs 210 and a display 212 to allow for operator inputs to the controller 200. A electrical output connector is provided for coupling a wide bandwidth coaxial cable 214 having wide bandwidth connectors, such as SMA connectors, from the probe controller 200 to the measurement instrument 12. The interconnect adapter 216, such as described in U.S. Pat. No. 6,402,549 and incorporated herein in its entirety by reference, includes a corresponding wide bandwidth connector. The interconnect adapter 216 may be modified to include signal lines for allowing communications between the measurement instrument 12 and the probe controller 200.

A signal acquisition probing system has been described where micro-cavity laser is used to acquire an electrical signal from a device under test. The micro-cavity laser has first and second VCSEL gain mediums and an electro-optic optical resonant cavity. The micro-cavity laser is pumped by an external laser source with each VCSEL generating a polarized laser output that is coupled to the optical resonant cavity. The polarization states of VCSELs' polarized laser are at 90° to each other. The micro-cavity laser generates respective polarized frequency modulated optical signals derived from the device under test electrical signal creating an electro-magnetic field distribution in electro-optic material in the micro-cavity laser that overlaps the optical path of the optical signal propagating in the electro-optic material. The electromagnetic field varies the index of refraction of the electro-optic material in the optical path. The frequency modulated optical signals are coupled to an optical receiver via the optical transmission system which converts the frequency modulated optical signals to an electrical signal. The electrical signal is coupled to measurement test instrument for processing and displaying of the electrical signal. The signal acquisition probing system included control circuitry for controlling the optical power level and wavelength of the optical signal from the optical transmitter and the gain of the output electrical signal from the optical receiver.

It will be obvious to those having skill in the art that many changes may be made to the details of the above-described embodiments of this invention without departing from the underlying principles thereof. The scope of the present invention should, therefore, be determined only by the following claims.

What is claimed is:

1. A signal acquisition probing system using electro-optic detection for sensing an electrical signal from a device under test comprising:
   an optical transmitter generating a coherent optical signal;
   a micro-cavity laser having an optical gain cavity formed with two vertical cavity surface emitting lasers disposed between opposing optically reflective materials that receives the optical signal from the optical transmitter and generates first and second polarized optical outputs whose polarization states are orthogonal to each other, and an optical resonant cavity having electro-optic material disposed between opposing optically reflective materials with one of the optically reflective materials being a common reflective material with one of the optical reflective materials of the optical gain cavity that receives the first and second polarized optical outputs from the optical gain cavity;
   first and second electrically conductive electrodes receiving the electrical signal from the device under test with each of the first and second electrically conductive electrodes being formed in at least a portion of the electro-optic material generally parallel to the first and second polarized optical outputs propagating within the electro-optic material, the first and second electrically conductive electrodes being oriented along an axis bisecting the polarization states of the first and second polarized optical outputs;

an optical transmission system optically coupled to the optical transmitter, micro-cavity laser and an optical receiver providing the optical signal from the optical transmitter to the micro-cavity laser and providing first and second polarized frequency modulated optical signals to the optical receiver representing the electrical signal from the device under test derived from the device under test electrical signal creating an electromagnetic field distribution in the electro-optic material that overlaps the optical path of the first and second polarized optical outputs propagating in the electro-optic material, which varies the index of refraction of the electro-optic material in the optical path; and the optical receiver generating an output electrical signal from the first and second polarized frequency modulated optical signals from the micro-cavity laser.

2. The signal acquisition probing system as recited in claim 1 further comprising a resistor coupled between the first and second electrically conductive electrodes.

3. The signal acquisition probing system as recited in claim 1 further comprising a resistor coupled to each of the first and second electrically conductive electrodes.

4. The signal acquisition probing system as recited in claim 1 wherein the micro-cavity laser further comprises electrically conductive contacts formed on an exterior surface of the micro-cavity laser with the one of the electrically conductive contacts electrically coupled to the first electrically conductive electrode and the other electrically conductive contact electrically coupled to the second electrically conductive electrode.

5. The signal acquisition probing system as recited in claim 4 further comprising a resistor coupled between the electrically conductive contacts.

6. The signal acquisition probing system as recited in claim 4 further comprising a resistor coupled to each of the electrically conductive contacts.

7. The signal acquisition probing system as recited in claim 1 wherein the first and second polarized optical output from the optical gain cavity propagates generally parallel to at least a first optical axis in the electro-optic material with the first and second electrically conductive electrodes generally parallel to same optical axis.

8. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the Y-crystal face and the first and second electrically conductive electrodes being orthogonal to the Y-crystal face of the electro-optic material.

9. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the X-crystal face and the first and second electrically conductive electrodes being orthogonal to the X-crystal face of the electro-optic material.

10. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the Z-crystal face and the first and second electrically conductive electrodes being orthogonal to the Z-crystal face of the electro-optic material.

11. The signal acquisition probing system as recited in claim 1 wherein the optical transmission system further comprises an optical bean splitter coupled to receive the optical signal from the optical transmitter and the polarized frequency modulated optical signals from the micro-cavity laser, first and second collimating lenses with the first collimating lens optically coupled to the optical beam splitter and the second collimating lens optically coupled to the micro-cavity laser and a polarization maintaining single mode optical fiber coupled between the first and second collimating lenses.

12. The signal acquisition probing system as recited in claim 11 wherein the optical receiver further comprises:

a birefringent etalon optically coupled to receive the polarized frequency modulated optical signals from the micro-cavity laser via the optical beam splitter of the optical transmission system, and generating polarized intensity modulated optical signals representative of the electrical signal from the device under test;

a non-polarizing beam splitter receiving the polarized intensity modulated optical signals and coupling a first portion to a first optical-to-electrical converter and coupling a second portion to a polarizing beam splitter, with the first optical-to-electrical converter generating an electrical signal representative of the electrical signal under test;

an amplifier coupled to receive the electrical signal from the first optical-to-electrical converter and generating an amplified electrical signal representative of the electrical signal from the device under test;

a second optical-to-electrical converter coupled to receive one of the polarized intensity modulated optical signal from the polarizing beam splitter and a third optical-to-electrical converter coupled to receive the other polarized intensity modulated optical signal from the polarizing beam-splitter; with each of the second and third optical-to-electrical converters generating an electrical signal representative of one of the respective polarized intensity modulated optical signals;

an amplifier circuit receiving the electrical signals from the second and third optical-to-electrical converters and generating an electrical signal representative of the difference over the sum of the electrical signals from the second and third optical-to-electrical converters; and a tilt control coupled to the birefringent etalon receiving the electrical signal from the amplifier circuit for tuning the birefringent etalon to maintain lock between the birefringent etalon and the micro-cavity laser.

13. The signal acquisition probing system as recited in claim 1 further comprising an acoustic damping material substantially covering the micro-cavity laser to minimize acoustic modes in the micro-cavity laser.

* * * * *